United States Patent [19]

Livolsi

[11] Patent Number: 5,280,204

[45] Date of Patent: Jan. 18, 1994

[54] ECI COMPATIBLE CMOS OFF-CHIP DRIVER USING FEEDBACK TO SET OUTPUT LEVELS

[75] Inventor: Robert R. Livolsi, Shokan, N.Y.

[73] Assignee: International Business Machines Corporation, Armonk, N.Y.

[21] Appl. No.: 907,906

[22] Filed: Jul. 2, 1992

[51] Int. Cl.$^5$ .......................................... H03K 19/017
[52] U.S. Cl. .................... 307/475; 307/443; 307/473
[58] Field of Search ............... 307/443, 445, 451, 473, 307/475

[56] References Cited

U.S. PATENT DOCUMENTS

| | | | |
|---|---|---|---|
| 4,782,025 | 11/1988 | Adams et al. | 307/473 |
| 4,988,888 | 1/1991 | Hirose et al. | 307/443 |
| 4,998,028 | 3/1991 | Chappell et al. | 307/475 |
| 5,015,880 | 5/1991 | Drake et al. | 307/443 |
| 5,122,690 | 6/1992 | Bianchi | 307/443 X |
| 5,151,621 | 9/1992 | Goto | 307/473 X |
| 5,153,457 | 10/1992 | Martin et al. | 307/475 X |
| 5,166,558 | 11/1992 | Ohsawa | 307/451 X |
| 5,214,317 | 5/1993 | Nguyen | 307/475 X |

*Primary Examiner*—David R. Hudspeth
*Attorney, Agent, or Firm*—Lynn L. Augspurger

[57] ABSTRACT

An ECL off-chip driver for CMOS circuits is composed of three sections. The first section is a CMOS inverter stage which receives an inhibit input. The second section is a CMOS AND gate which receives an enable input and the complemented first from the inverter stage. The third stage is itself composed of two stages, a pre-driver stage and an output driver stage. The pre-driver stage includes a CMOS NAND gate and a CMOS NOR gate both of which receive a data input and, respectively, the output and the complemented output of the AND gate. The driver stage includes first and second drive FETs of complementary type connected to an output terminal, said first drive FET being driven by the NAND gate and the second drive FET being driven by the NOR gate. Feedback FETs sense an output signal level and control the first and second drive FETs to produce ECL compatible voltage levels. The feedback FETs are cross-coupled respectively to the NOR and NAND gates to provide added stability in amplitude regulation.

5 Claims, 1 Drawing Sheet

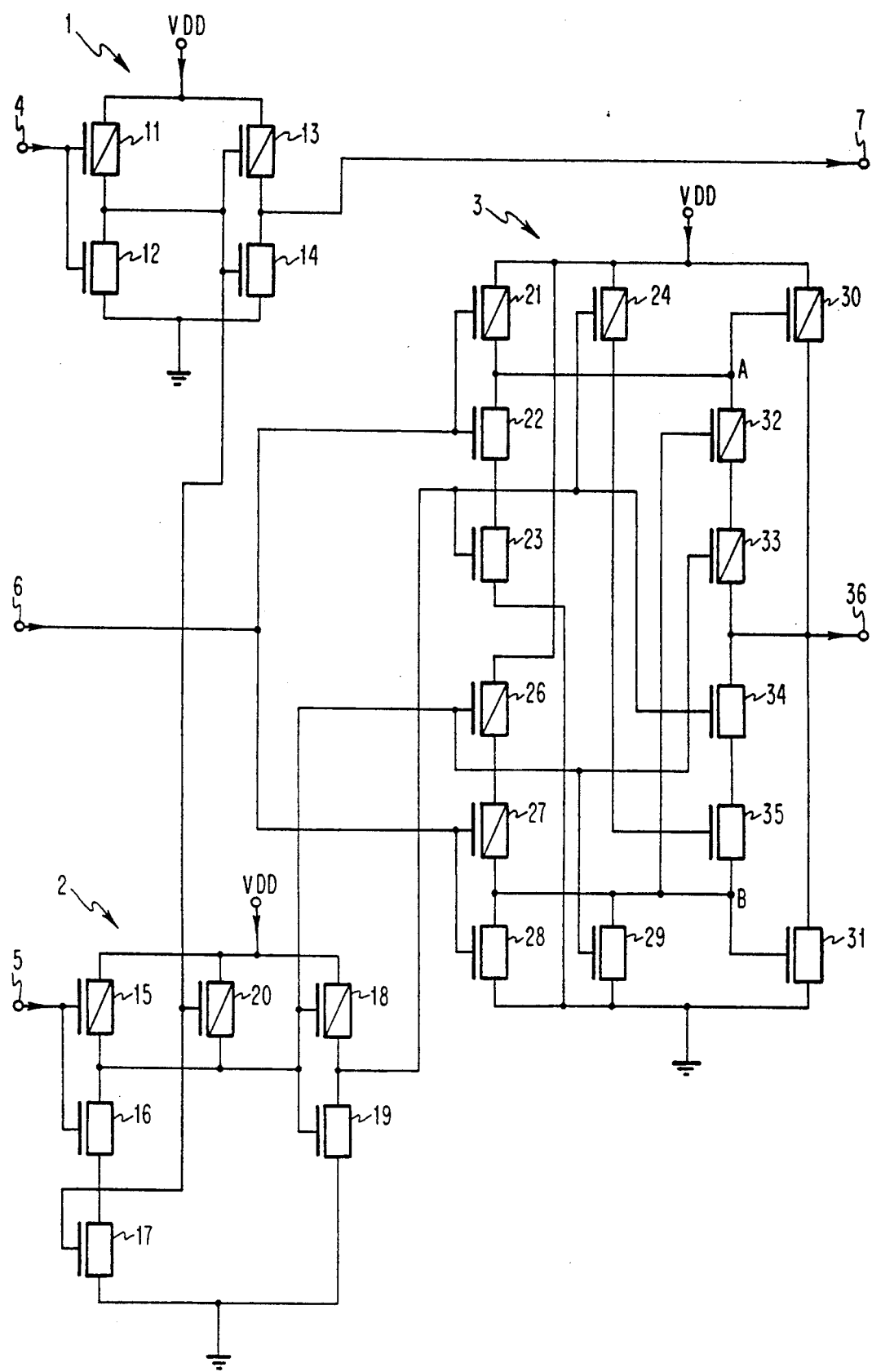

ECL COMPATIBLE CMOS OFF-CHIP DRIVER USING FEEDBACK TO SET OUTPUT LEVELS

BACKGROUND OF THE INVENTION

1. Field of the Invention

The present invention generally relates to a CMOS off-chip driver (OCD) and, more particularly, to a high-performance CMOS interface which generates shifted level voltage swings and is compatible emitter coupled logic (ECL).

2. Description of the Prior Art

High speed data transmission over long cable distances has been limited to bipolar differential circuits using emitter coupled logic (ECL) levels. With the advent of complementary metal oxide semiconductor (CMOS) field effect transistor (FET) technology, very high circuit densities are achievable. However, CMOS circuits do not have the small signal, high data rate capability of bipolar ECL circuits. Previous work in the area of CMOS ECL circuits demonstrated the ability to provide limited voltage swings using a single power supply. See, for example, U.S. Pat. No. 4,998,028 to Barbara A. Chappell et al. which discloses a circuit that is not applicable to standard cell logic methodology.

SUMMARY OF THE INVENTION

It is therefore an object of the present invention to provide a CMOS circuit that provides ECL compatible shifted level voltage swings.

It is another object of the invention to provide an ECL compatible CMOS circuit that is capable of driving various load conditions such as terminated and unterminated transmission lines as well as very long high speed differential cable nets.

It is a further object of this invention to provide a circuit that is applicable in a standard cell design methodology.

It is yet another object of the invention to provide a CMOS circuit compatible with ECL levels that contributes to the stability and amplitude control over process, voltage and temperature variations.

According to the invention, there is provided a CMOS off-chip driver (OCD) which allows standard CMOS technology to be used in high speed data transmission paths. This driver generates shifted levels compatible with standard bipolar ECL levels. The circuit incorporates a unique cross coupled pass gate feedback design. The pass gates provide both isolation and amplitude control. A double feedback is obtained by the gates of the feedback pass gates sensing the output FET gate drives, thereby enhancing stability.

BRIEF DESCRIPTION OF THE DRAWINGS

The foregoing and other objects, aspects and advantages will be better understood from the following detailed description of a preferred embodiment of the invention with reference to the drawings, in which the sole FIGURE is a schematic diagram of the CMOS shifted level, ECL compatible off-chip driver (OCD) for standard cell logic books according to the invention.

DETAILED DESCRIPTION OF A PREFERRED EMBODIMENT OF THE INVENTION

Referring now to the drawing, there is shown the CMOS off-chip driver (OCD) according to the invention. The driver consists of three separate sub-circuits or sections 1, 2 and 3, each receiving inputs on respective input terminals 4, 5 and 6. The input on terminal 4 is an inhibit input, that on terminal 5 is an enable input, and that on terminal 6 is a data input.

The first section 1 consists of two cascaded inverter stages respectively composed of series connected P-type FET 11 and N-type FET 12 and series connected P-type FET 13 and N-type FET 14. The sources of FETs 11 and 13 are connected to a source of positive voltage $V_{DD}$, while the sources of FETs 12 and 14 are connected to circuit ground. The gates of FETs 11 and 12 forming the first inverter stage are connected to inhibit input terminal 4, while the drains of FETs 13 and 14 forming the second inverter stage are connected to an output terminal 7 which may be used to drive other inhibit terminals on the chip. The drains of FETs 11 and 12 are connected to the gates of FETs 13 and 14 to make the cascade connection of the two inverter stages.

The second section is a simple AND gate comprising series connected P-type FET 15 and N-type FETs 16 and 17 and P-type FET 20 connected in parallel with P-type FET 15 and an inverter stage composed of series connected P-type FET 18 and N-type FET 19. The sources of each of FETs 15, 18 and 20 are connected to the source of voltage $V_{DD}$, and the sources of FETs 17 and 19 are connected to circuit ground. Enable input terminal 5 is connected to the gates FETs 15 and 16, while the output of the first inverter stage composed of FETs 11 and 12 in the first section is connected to the gates of FETs 17 and 20. The drains of FETs 15, 16 and 20 are connected in common to the gates of FETs 18 and 19. The function of the AND gate is to provide isolation for boundary scan and user applications.

The input of the third section comprises a NAND gate and a NOR gate. The NAND gate comprising series connected P-type FET 21 and N-type FETs 22 and 23 and P-type FET 24 connected in parallel with FET 21. The sources of FETs 21 and 24 are connected to the source of voltage $V_{DD}$, and the source of FET 23 is connected to circuit ground. The source of FET 22 is connected to the drain of FET 23. The drain of FET 22 is connected to the drains of FETs 21 and 24, producing a drive signal on node A to the gate of P-type FET 30. The gates of FETs 23 and 24 are connected to the output of the AND gate of the second section described above. This provides the user with the capability to isolate the ECL drive node A from the load environment. The gates of FETs 21 and 22 are driven by input terminal 6. Terminal 6 is the data input to the OCD from internally driven logic gates or latches.

A simple NOR gate is comprised of the series connected P-type FETs 26 and 27 and N-type FET 28 and N-type FET 29 connected in parallel with FET 28. The source of FET 26 is connected to the voltage source $V_{DD}$, and the sources of FETs 28 and 29 are connected to circuit ground. The source of FET 27 is connected to the drain of FET 26, while the drain of FET 27 is connected to the drains of FETs 28 and 29 producing a drive signal on node B to the gate of N-type FET 31. The gates of FETs 26 and 29 are connected to the gates of FETs 18 and 19 of the AND gate of the second section described above. This provides the user with the capability to isolate the ECL drive node B from the load environment. The gates of the FETs 27 and 28 are connected to input terminal 6.

A pass gate feedback path from the output terminal 36 to the ECL drive node A is comprised of a series connection of P-type FETs 32 and 33. The source of FET 32 is connected to node A. The source of FET 33 is connected to the drain of FET 32, while the drain of FET 33 is connected to terminal 36. The gate of FET 33 is connected to the gates of FETs 18 and 19 of the AND gate of the second section described above. The gate of FET 32 is cross coupled to node B to sense the ECL drive voltage on the gate of N-type FET 31. Another pass gate feedback path from output terminal 36 to node B is comprised of a series connection of N-type FETs 34 and 35. The drain of FET 34 is connected to the output terminal 36. The source of FET 34 is connected to the drain of FET 35, and the source of FET 35 is connected to node B. The gate of FET 34 is connected to the output of the AND gate of the second section described above, providing the user with the capability of isolating the ECL drive node B from the load environment. The gate of FET 35 is cross coupled to node A to sense the ECL drive voltage on the gate of FET 30.

The output devices are comprised of a series connection of P-type FET 30 and N-type FET 31. The source of FET 30 is connected to the voltage source $V_{DD}$, and the source of FET 31 is connected to ground. The drains of FETs 30 and 31 are connected to the output terminal 36 and the drains of FETs 33 and 34. The gate of FET 30 is connected to node A, while the gate of FET 31 is connected to node B.

The input drive signal at input terminal 6 is either a full logical zero ("0") or one ("1") to the NAND and NOR gates which comprise the input of the third section. When the input enable signal at input terminal 5 is a logical "1" and when the input inhibit signal at terminal 4 is a logical "0", the driver is enabled to pass the input drive signal at terminal 6 to the output terminal 36 with a shifting of the signal swing from standard CMOS levels at terminal 6 to shifted level ECL compatible levels at terminal 36. When the logical signal at input enable terminal 5 is a logical "0" or when the inhibit input terminal 4 is a logical "1", the signal present at input terminal 6 is not passed to the output terminal 36 as a shifted level ECL compatible signal, and the output terminal 36 is isolated from the logical drive signal at input terminal 6.

The NAND and NOR gates respectively drive nodes A and B which respectively drive the output FETs 30 and 31. A logical "1" on terminal 6 translates to a logical "0" initially on nodes A and B. This turns on P-type FETs 30 and 32 and turns off N-type FETs 31 and 35. As the output voltage at terminal 36 begins to rise, the voltage at node A also begins to rise, cutting back the drive current from FET 30 and causing the voltage at terminal 36 to stabilize. The voltage rise at node A also begins to turn on FET 35 causing the voltage at node B to rise. This causes the output FET 31 to turn on, further stabilizing the voltage at output terminal 36 during over drive conditions. A logical "0" at the input terminal 6 translates to a logical "1" level initially at nodes A and B. This turns off P-type FETs 30 and 32 and turns on N-type FETs 31 and 35. As the voltage at terminal 36 begins to fall, the voltage at node B also begins to fall cutting back the drive of FET 31 and stabilizing the output voltage at output terminal 36. As the voltage at node B begins to fall, FET 32 begins to turn on causing the voltage at node A to fall, turning on FET 30 to further stabilize the voltage at output terminal 36.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A CMOS off-chip driver circuit generating output voltage swings compatible with ECL levels comprising:

enable circuit means for generating true and complement outputs in response to an enable input signal;

a CMOS NAND gate receiving a data input signal and said true output of said enable circuit means and generating a NANDed output signal;

a CMOS NOR gate receiving said data input signal and said complement output of said enable circuit means and generating a NORed output signal;

first and second drive FETs of complementary type connected to an output terminal, said first drive FET being driven by said NANDed output signal and said second drive FET being driven by said NORed output signal; and feedback means for sensing an output signal level on said output terminal and controlling said first and second drive FETs to produce ECL compatible voltage levels.

2. The CMOS off-chip driver circuit recited in claim 1 wherein said enable circuit means comprises:

a CMOS inverter stage receiving an inhibit input signal and generating a complement inhibit output signal; and a CMOS AND gate receiving an enable input signal and said complement inhibit output signal and generating an ANDed output signal as said true output signal and a complementary ANDed output signal as said complement output signal.

3. The CMOS off-chip driver circuit recited in claim 1 wherein said feedback means comprises a first feedback FET of the same conductivity type as said first drive FET and a second feedback FET of the same conductivity type as said second driver FET, said first and second feedback FETs being cross-coupled respectively to said NORed output signal and said NANDed output signal.

4. The CMOS off-chip driver circuit recited in claim 3 wherein said feedback means further comprises a third FET of the same conductivity type as said first drive FET connected in series with said first feedback FET between a gate of said first drive FET and said output terminal, said third FET being driven by said NORed output signal, and a fourth FET of the same conductivity type as said second drive FET connected in series with said second feedback FET between a gate of said second drive FET and said output terminal, said fourth FET being driven by said NANDed output signal.

5. A CMOS off-chip driver circuit generating output voltage swings compatible with ECL levels comprising:

a CMOS inverter stage receiving an inhibit input signal and generating a complement inhibit output signal; and a CMOS AND gate receiving an enable input signal and said complement inhibit output signal and generating an ANDed output signal and a complementary ANDed output signal;

a CMOS NAND gate receiving a data input signal and said ANDed output signal and generating a NANDed output signal;

a CMOS NOR gate receiving said data input signal and said complementary ANDed output signal and generating a NORed output signal;

first and second drive FETs connected to an output terminal, said first drive FET being a P-type FET and driven by said NANDed output signal and said second drive FET being an N-type FET and driven by said NORed output signal; and feedback means for sensing an output signal level on said output terminal and controlling said first and second drive FETs to produce ECL compatible voltage levels, said feedback means comprising first and second P-type feedback FETs connected in series between a gate of said first drive FET and said output terminal and third and fourth N-type feedback FETs connected in series between a gate of said second drive FET and said output terminal, said first and third feedback FETs being cross-coupled respectively to said NORed output signal and said NANDed output signal and said second and fourth feedback FETs being connected respectively to said ANDed and complementary ANDed output signals.

* * * * *